United States Patent [19]
Fulford et al.

[11] Patent Number: 5,920,103
[45] Date of Patent: Jul. 6, 1999

[54] ASYMMETRICAL TRANSISTOR HAVING A GATE DIELECTRIC WHICH IS SUBSTANTIALLY RESISTANT TO HOT CARRIER INJECTION

[75] Inventors: H. Jim Fulford, Austin; Mark I. Gardner, Cedar Creek, both of Tex.

[73] Assignee: Advanced Micro Devices, Inc., Sunnyvale, Calif.

[21] Appl. No.: 08/879,508

[22] Filed: Jun. 20, 1997

[51] Int. Cl.⁶ .................................................. H01L 29/76
[52] U.S. Cl. ........................... 257/408; 257/344; 257/345
[58] Field of Search .................................... 257/408, 409, 257/410, 411, 335, 336, 334, 345

[56] References Cited

U.S. PATENT DOCUMENTS

| | | | |
|---|---|---|---|
| 4,356,623 | 11/1982 | Hunter . | |
| 4,835,112 | 5/1989 | Pfiester et al. | 437/24 |
| 5,286,664 | 2/1994 | Horiuchi | 437/44 |
| 5,369,297 | 11/1994 | Kusunoki et al. | 257/411 |
| 5,382,533 | 1/1995 | Ahmad et al. . | |
| 5,436,482 | 7/1995 | Ogoh | 257/408 |
| 5,460,992 | 10/1995 | Hasegawa . | |
| 5,516,707 | 5/1996 | Loh et al. | 437/24 |
| 5,554,871 | 9/1996 | Yamashita et al. | 257/408 |
| 5,648,284 | 7/1997 | Kusunoki et al . | |
| 5,650,344 | 7/1997 | Ito et al. . | |
| 5,668,028 | 9/1997 | Bryant . | |
| 5,674,788 | 10/1997 | Wristers et al. | 257/410 |
| 5,705,439 | 1/1998 | Chang | 438/286 |
| 5,712,208 | 1/1998 | Tseng et al. . | |
| 5,726,087 | 3/1998 | Tseng et al. . | |
| 5,759,897 | 6/1998 | Kadosh et al. | 438/286 |

OTHER PUBLICATIONS

Advanced Products Research and Development Laboratory, Motorola, Inc., Austin, Texas, "Suppression of MOSFET Reverse Short Channel Effect by N2O Gate Poly Reoxidation Process," Tsui, et al., Published by IEEE, New York, 1994, 4 pages.

Primary Examiner—Sara Crane
Attorney, Agent, or Firm—Conley, Rose & Tayon; Robert C. Kowert; Kevin L. Daffer

[57] ABSTRACT

A transistor fabrication process is provided which derives a benefit from having an asymmetrical LDD structure. A gate oxide layer is grown across a silicon-based substrate. A polysilicon layer is then deposited across the gate oxide layer. Portions of the polysilicon layer and the oxide layer are removed to form a gate conductor and gate oxide, thereby exposing source-side and drain-side junctions within the substrate. The source-side and drain-side junctions are implanted with a dopant to form LDD areas therein. The source-side junction may then be exclusively implanted to form a heavily doped source region in the source-side junction. An etch stop material may be formed upon opposed sidewall surfaces of the gate conductor, the upper surface of the gate conductor, and the source-side and drain-side junctions. Spacers may then be formed laterally adjacent the etch stop material located upon sidewall surfaces of the gate conductor. The unmasked portions of the source-side and drain-side junctions are heavily doped, resulting in source and drain regions that are aligned to the exposed lateral edges of the spacers. The drain-side spacer is removed and barrier atoms are forwarded through the exposed etch stop material and into a substrate/gate oxide interface region near the drain junction. The barrier atoms help reduce hot electron effects by blocking diffusion avenues of carriers (holes or electrons) from the drain-side junction into the gate oxide.

15 Claims, 5 Drawing Sheets

ASYMMETRICAL TRANSISTOR HAVING A GATE DIELECTRIC WHICH IS SUBSTANTIALLY RESISTANT TO HOT CARRIER INJECTION

BACKGROUND OF THE INVENTION

1. Field of the Invention

This invention relates to the manufacture of an integrated circuit and, more particularly, to the formation of an n-channel and/or p-channel asymmetrical transistor having barrier atoms incorporated in a defined lateral area beneath a gate dielectric to enhance transistor performance.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material and gate oxide is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

The gate conductor and adjacent source/drain areas (herein "junctions") are formed using well known photolithography and ion implant techniques. Gate conductors and source/drain regions arise in openings formed through a thick dielectric layer of what is commonly referred to as field oxide. Those openings and the transistors formed therein are termed active regions. The active regions are therefore regions between field oxide regions. Metal interconnect is routed over the field oxide to couple with the polysilicon gate conductor as well as with the junction to complete the formation of an integrated circuit.

Integrated circuits utilize either n-channel devices exclusively, p-channel devices exclusively, or a combination of both on a single monolithic substrate. While both types of devices can be formed, the devices are distinguishable based on the dopant species used. The method by which n-type dopant is used to form an n-channel device and p-type dopant is used to form a p-channel device entails unique problems associated with each device. As layout densities increase, the problems are exacerbated. Device failure can occur unless adjustments are made to processing parameters and processing steps. N-channel processing must, in most instances, be dissimilar from p-channel processing due to the unique problems of each type of device.

N-channel devices are particularly sensitive to so-called short-channel effects ("SCE"). The distance between a source-side junction and a drain-side junction is often referred to as the physical channel length. However, after implantation and subsequent diffusion of the junctions, the actual distance between junctions becomes less than the physical channel length and is often referred to as the effective channel length ("Leff"). In VLSI designs, as the physical channel becomes small, so too must the Leff. SCE becomes a predominant problem whenever Leff drops below approximately 2.0 μm.

Generally speaking, SCE impacts device operation by, inter alia, reducing device threshold voltages and increasing sub-threshold currents. As Leff becomes quite small, the depletion regions associated with the source and drain areas within the junctions may extend toward one another and substantially occupy the channel area. Henceforth, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold amount, current between the source and drain nonetheless exist for transistors having a relatively short Leff. One method in which to control SCE is to increase the dopant concentration within the body of the device. Unfortunately, increasing dopant within the body deleteriously increases potential gradients in the ensuring device.

Increasing the potential gradients produces an additional effect known as hot-carrier effect ("HCE"). HCE is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel. The electric field at the drain primarily causes electrons in the channel to gain kinetic energy and become "hot". As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, HCE causes a greater threshold skew in NMOS transistors than PMOS transistors. Nonetheless, a PMOS transistor will undergo negative threshold skew if its Leff is less than, e.g., 0.8 μm.

Unless modifications are made to the transistor structure, problems of sub-threshold current and threshold shift resulting from SCE and HCE will remain. To overcome these problems, alternative drain structures such as double-diffused drains (DDDs) and lightly doped drains (LDDs) must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the gate conductor followed by a heavier dopant self-aligned to the gate conductor on which two sidewall spacers have been formed. The purpose of the first implant dose is to produce a lightly doped section of both the source and drain areas at the gate edge near the channel. The second implant dose is spaced from the channel a distance dictated by the thickness of the sidewall spacer. Resulting from the first and second implants, a dopant gradient occurs at the junction between the source and channel as well as the junction between the drain and channel.

A properly defined LDD structure must be one which minimizes HCE without the expense of excessive source/drain resistance. The addition of an LDD implant adjacent the channel unfortunately adds resistance to the source/drain path. This added resistance, generally known as parasitic resistance, can have many deleterious effects. First, parasitic resistance can decrease the saturation current (i.e., current above threshold). Second, parasitic resistance can decrease the overall speed of the transistor.

The deleterious effects of decreasing saturation current and transistor speed is best explained in reference to a transistor having a source resistance and a drain resistance. The source and drain parasitic resistances are compounded by the presence of the conventional source and drain LDDs. Using a n-channel example, the drain resistance $R_D$ causes the gate edge near the drain to "see" a voltage less than VDD, to which the drain is typically connected. Similarly, the source resistance $R_S$ causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT}=K/2*(V_{GS}-V_T)^2$$

where $I_{DSAT}$ is saturation current, K is a value derived as a function of the process parameters used in producing the transistor, and $V_T$ is the threshold voltage. Reducing or eliminating $R_S$ would therefore draw the source voltage closer to ground, thereby increasing the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCE control. Accordingly, substantial LDD is required in the drain area. It would therefore seem beneficial to decrease $R_S$ rather than $R_D$. This implies the need for a process for decreasing $R_S$ (source-side LDD area) while maintaining $R_D$ (drain-side LDD area).

Proper LDD design must take into account the need for minimizing parasitic resistance $R_S$ at the source side while at the same time attenuating Em at the drain-side of the channel. Further, proper LDD design requires that the injection position associated with the maximum electric field Em be located under the gate conductor edge, preferably well below the silicon surface. It is therefore desirable to derive an LDD design which can achieve the aforesaid benefits while still properly placing and diffusing Em. This mandates that the channel-side lateral edge of the LDD area be well below the edge of the gate. Regardless of the LDD structure chosen, the ensuing transistor must be one which is not prone to excessive sub-threshold currents, even when the Leff is less than, e.g., 2.0 μm.

A properly designed LDD-embodied transistor which overcomes the above problems must therefore be applicable to either an n-channel transistor or a p-channel transistor. That transistor must be one that is readily fabricated within existing process technologies. In accordance with many modern fabrication techniques, it is further desirable that the improved transistor be formed having a majority carrier within the polysilicon gate of the same type as that of the junction regions (i.e., LDD implant and/or source/drain regions).

SUMMARY OF THE INVENTION

The problems outlined above are in large part solved by an improved technique for forming a p-channel or a n-channel transistor. The transistor hereof is classified as an asymmetrical transistor in that the LDD implant is purposefully formed exclusively in the drain-side junction between the channel and the drain region. Thus, LDD area is eliminated from the source-side of the transistor.

LDD implant focused primarily at the drain-side maintains parasitic resistance of the drain LDD (i.e., $R_D$) but reduces, if not eliminates, parasitic resistance $R_S$ associated with the source-side LDD implant. Thus, such a drain-engineered structure serves to attenuate the maximum electric field Em in the critical drain area while reducing parasitic resistance $R_S$ near the source area. The drain-side LDD area is bounded by a junction which exists below the gate edge and below the silicon surface. The LDD area, however, is attributed solely or primarily to the critical area near the drain. Shifting the electric field, Em, occurs only in the region where shifting is necessary, i.e., only in the drain-side of the channel.

The p- or n-channel transistor formed as a result of the present LDD design receives the benefit of reduced HCE but not at the expense of performance (i.e., switching speed or saturation current). Even when Leff is less than 2.0 μm, where SCE would normally be a problem, the present LDD-embodied transistors experience minimal sub-threshold currents. The present transistor advantageously employs a net p- or n-type dopant in the polysilicon gate which matches the dopant within the source and drain areas. By utilizing similar dopant within the polysilicon gate as that used in the LDD and source/drain, the present process can be more readily incorporated into existing process flows.

Equally important in the present process is a step used to further reduce HCE by incorporating barrier atoms within a gate conductor and a lateral area underneath the gate conductor. Barrier atoms emanating from a high temperature furnace or a rapid thermal anneal ("RTA") chamber may traverse an etch stop layer on the sidewall surfaces of the gate conductor and migrate into vacancies and opportune bond sites near the surface of the silicon substrate. The improvement in hot-carrier reliability is mainly attributed to the presence of barrier atoms at the interface between the silicon substrate and the gate oxide (i.e., the $Si/SiO_2$ interface), particularly in proximity to the drain. Thus, a majority of high-energy carriers (electrons or holes) cannot migrate into the gate oxide since barrier atoms occupy a substantial portion of the migration avenues at the substrate/oxide interface. Further, charge carrier trapping of electrons that escape into the gate oxide is limited because, e.g., strong Si—N bonds exist in place of weaker Si—H and strained Si—O bonds. It is preferred the barrier atoms be nitrogen atoms, however, it is not necessary the barrier atoms be limited exclusively to nitrogen. It is further preferred the barrier atoms exist at the substrate/oxide interface between the drain-side junction and the overlying gate conductor. Barrier atoms thusly placed minimize hot carrier injection into the gate conductor predominantly from the drain-side junction.

In an embodiment of the present invention, a gate oxide is thermally grown within and upon an upper surface of a silicon-based substrate. A layer of polysilicon is then deposited across the oxide layer. Portions of the oxide layer and the polysilicon layer may be removed to form a gate conductor interposed between an exposed pair of silicon substrate regions (henceforth referred to as source-side and drain-side junctions). The source-side and drain-side junctions are implanted with a dopant to form LDD areas therein. A lithography step is performed to form a patterned masking layer, i.e., photoresist, across the drain-side junction and a portion of the gate conductor. The source-side junction may then be implanted with either a p-type or n-type dopant, depending on the desired type of transistor. A heavily doped source region is thusly formed in the source-side junction that is laterally adjacent to the gate conductor.

An etch stop material, such as a grown or deposited oxide may be formed upon opposed sidewall surfaces of the gate conductor, the upper surface of the gate conductor, and the source-side and drain-side junctions. Spacers may then be formed laterally adjacent the etch stop material located upon sidewall surfaces of the gate conductor. The spacers are made from a different material than the etch stop material. For instance, nitride spacers may be used. The combined lateral thickness of the spacers and the etch stop material extending from the sidewall surfaces mask select portions of the source-side and drain-side junctions. The unmasked portions of the source-side and drain-side junctions are then heavily doped, resulting in source and drain regions that are aligned to the exposed lateral edges of the spacers. Since the etch stop material is of different composition than the spacer, a wet etch may be applied to remove the drain-side spacer in lieu of the etch stop material. Barrier atoms, such as nitrogen are driven through the exposed etch stop material and into the critical substrate/gate oxide interface region.

BRIEF DESCRIPTION OF THE DRAWINGS

Other objects and advantages of the invention will become apparent upon reading the following detailed description and upon reference to the accompanying drawings in which:

FIG. 11a is a cross-sectional view of the semiconductor topography, wherein the semiconductor topography is subjected to thermal radiation in an ambient containing barrier atoms, subsequent to the step in FIG. 10a;

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
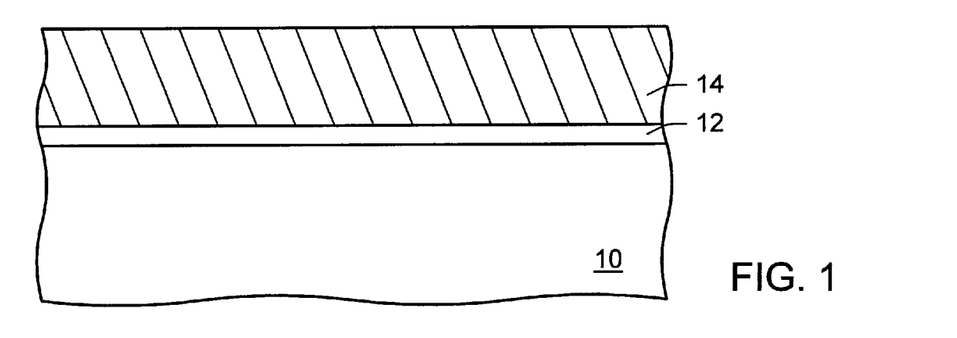
FIG. 1 is a cross-sectional view of semiconductor topography, wherein an oxide layer is grown across a silicon substrate and a polysilicon layer is deposited across the oxide layer.

Turning to FIG. 1, an oxide layer 12 is formed across a single crystalline silicon substrate 10. In one instance, oxide layer 12 may be formed by subjecting the silicon substrate to a gas having oxygen containing compounds, thereby promoting the growth of oxide layer 12 within and upon silicon substrate 10. Oxide layer 12 is primarily composed of silicon dioxide resulting from silicon atoms at the surface of substrate 10 bonding with the ambient oxygen atoms. A polysilicon layer 14 is then deposited across oxide layer 12. Polysilicon layer 14 is preferably formed by using chemical vapor deposition.

Figure 2:
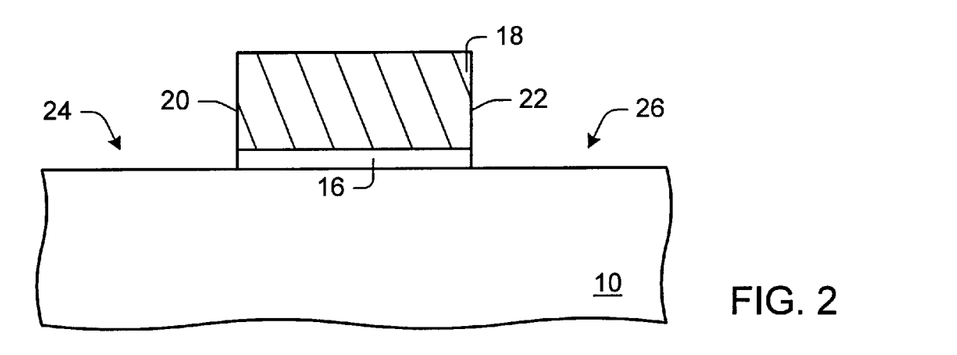
FIG. 2 is a cross-sectional view of the semiconductor topography, wherein portions of the oxide layer and the polysilicon layer are removed to form a gate oxide and a gate conductor interposed between a pair of junction areas embodied within the silicon substrate, subsequent to the step in FIG. 1.

FIG. 2 illustrates the formation of a gate conductor 18, a gate oxide 16, and exposed regions 24 and 26 of substrate 10. Portions of polysilicon layer 14 and oxide layer 12 may be etched to the underlying silicon substrate 10 using, for example, a dry, plasma etch. Etch duration is selected to terminate a pre-determined distance below the surface of polysilicon layer 14 before substantial surface portions of the substrate can be etched away. Exposed regions 24 and 26 are confined within active areas between gate conductor 18 and a field oxide (not shown). The resulting gate conductor 18 has relatively vertical opposed sidewall surfaces 20 and 22. Gate oxide 16 is interposed between substrate 10 and gate conductor 18. Regions 24 and 26 are spaced apart by gate oxide 16 and gate conductor 18, those regions are henceforth referred to as junction regions, although junctions are not formed until ions are actually forwarded therein.

Figure 3:
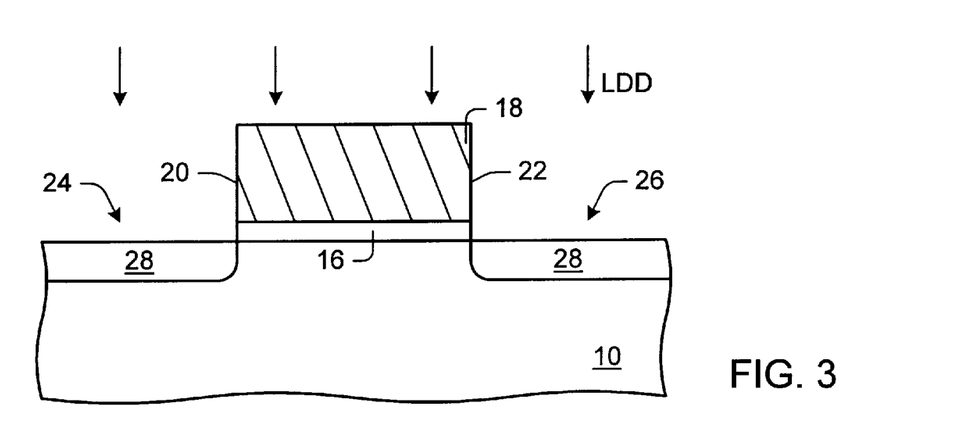
FIG. 3 is a cross-sectional view of the semiconductor topography, wherein a first dopant is implanted into the pair of junctions to form LDD areas, subsequent to the step in FIG. 2.
Figure 4:
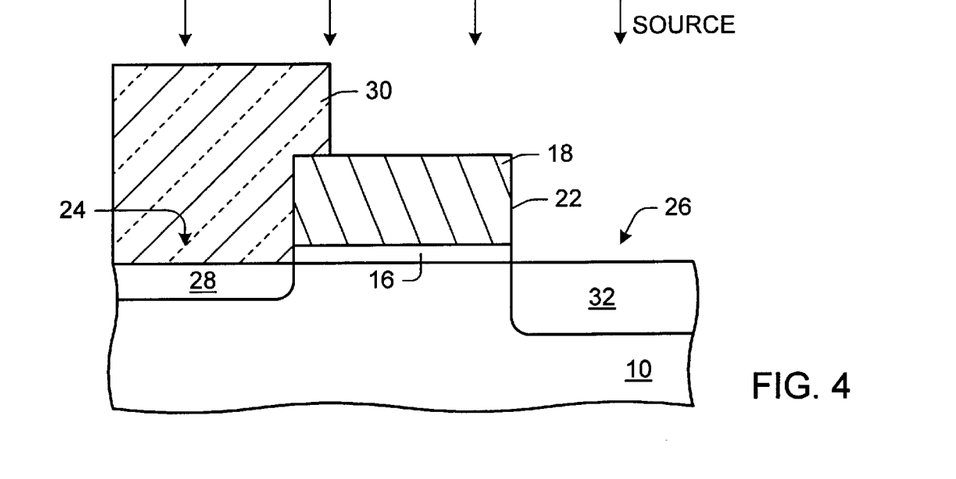
FIG. 4 is a cross-sectional view of the semiconductor topography, wherein a second dopant is implanted exclusively into the source-side junction, subsequent to the step in FIG. 3.

As illustrated in FIG. 3, a first dopant implant, i.e., an LDD implant, may then be forwarded into junction regions 24 and 26 to form LDD areas 28 within an upper portion of substrate 10. Turning to FIG. 4, a photoresist masking layer 30 is patterned across drain region 24 and a portion of gate conductor 18 using optical lithography. Advantageously, no exact alignment of masking layer 30 is required since it is only necessary to cover the drain-side Junction region 24 while exposing source region 26. Whether or not gate conductor 18 is exposed is of no importance to the present technique. Thus, masking layer 30, when patterned, can be aligned anywhere upon the gate conductor surface and/or upon the field oxide surface (not shown).

After masking layer 24 is patterned, a second dopant implant may be forwarded into source region 26 to form a source-side junction 32 within an upper portion of substrate 10. Masking layer 30 substantially prevents dopants from entering into drain-side junction area 24. The dopants implanted into source region 26 are preferably at a higher concentration than that used for the first dopant implant. Further, the dopants implanted may be n-type dopants or p-type dopants, depending on the desired type of transistor. Some commonly used n-type dopants are arsenic or phosphorus, and some commonly used p-type dopants are boron or boron difluoride. Since source-side junction 32 completely overlaps the source-side LDD area, source-side junction 32 dominates source region 26. Thus, junction 32 is heavily concentrated with dopants and exhibits a net low resistivity junction area on which a contact can be reliably made. Junction 32 is arranged within substrate 10 directly adjacent to sidewall surface 22. Subsequently, masking layer 30 may be removed (i.e., stripped) using well known techniques.

Figure 5:
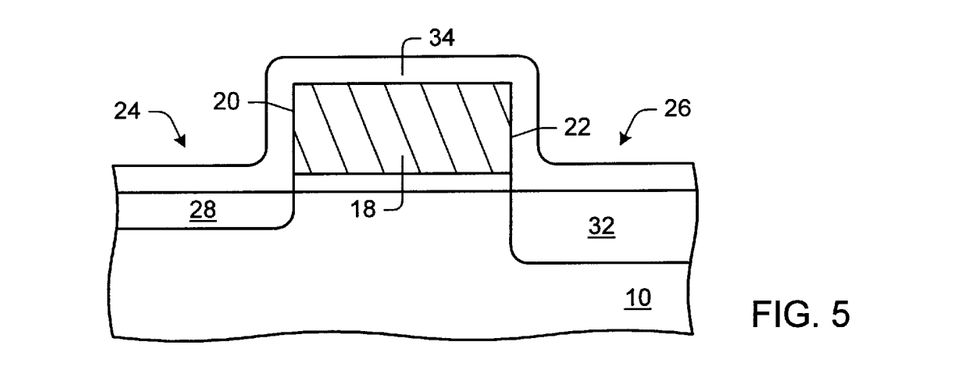
FIG. 5 is a cross-sectional view of the semiconductor topography, wherein an etch stop material is formed across the pair of junctions and the gate conductor, subsequent to the step in FIG. 4.
Figure 6:
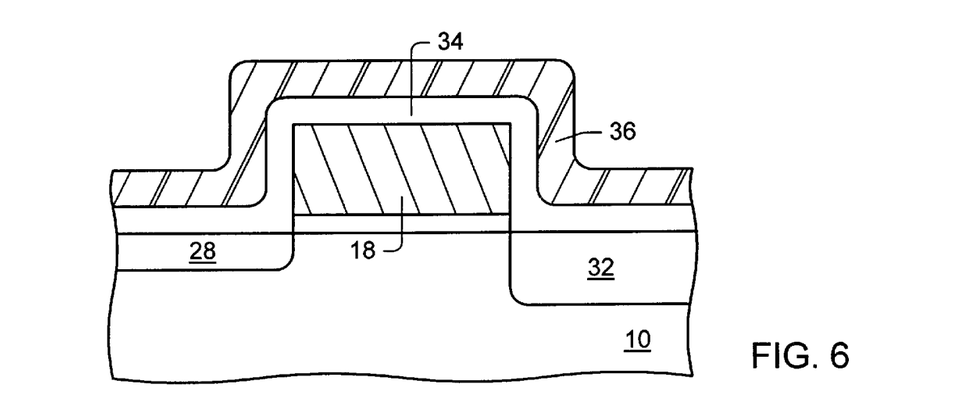
FIG. 6 is a cross-sectional view of the semiconductor topography, wherein spacer material is deposited across the oxide layer, subsequent to the step in FIG. 5.
Figure 7:
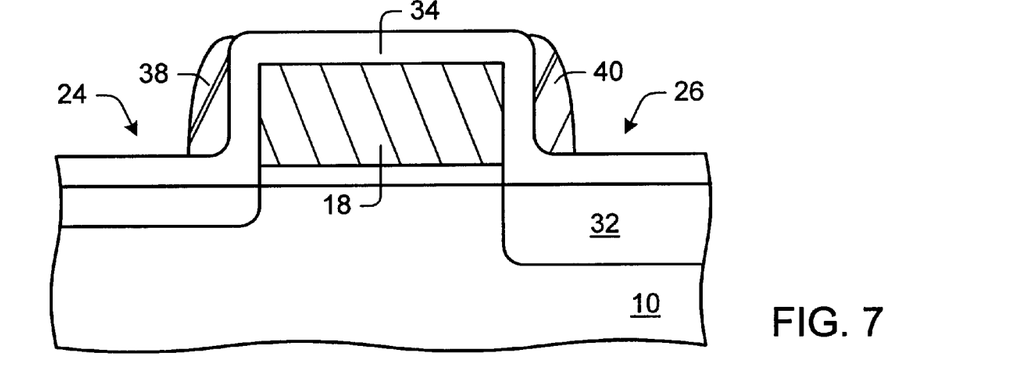
FIG. 7 is a cross-sectional view of the semiconductor topography, wherein portions of the spacer material are removed except from the etch stop material which covers sidewall surfaces of the gate conductor, subsequent to the step in FIG. 6.

As depicted in FIG. 5, an etch stop material 34 may be grown or deposited across regions 24 and 26 and gate conductor 18. Etch stop material 34 is preferably a material that etches at a slower rate than an overlying, subsequently formed spacer material. In this embodiment, etch stop material 34 is composed of oxide. Etch stop thickness is pre-selected such that it is not penetrated during removal of spacer material used in forming the ensuing spacer. FIG. 6 illustrates the deposition of a spacer material 36 entirely across etch stop material 34. Spacer material 36 is preferably composed of chemical vapor deposited nitride. As shown in FIG. 7, after material 36 is deposited, it is then removed at a faster rate along horizontal surfaces than vertical surfaces. The removal process is often referred to as an "anisotropic" etch process. The etch duration is terminated, however, before the entirety of material 36 is removed. Thus, material 36 is retained primarily on vertical surfaces of etch stop material 34 adjacent the sidewall surfaces of gate conductor 18. The retained portions form spacers 38 and 40. Etch duration is chosen to last until the lateral thickness of the spacers sufficiently masks portions of junction regions 24 and 26 near the channel.

Figure 8:
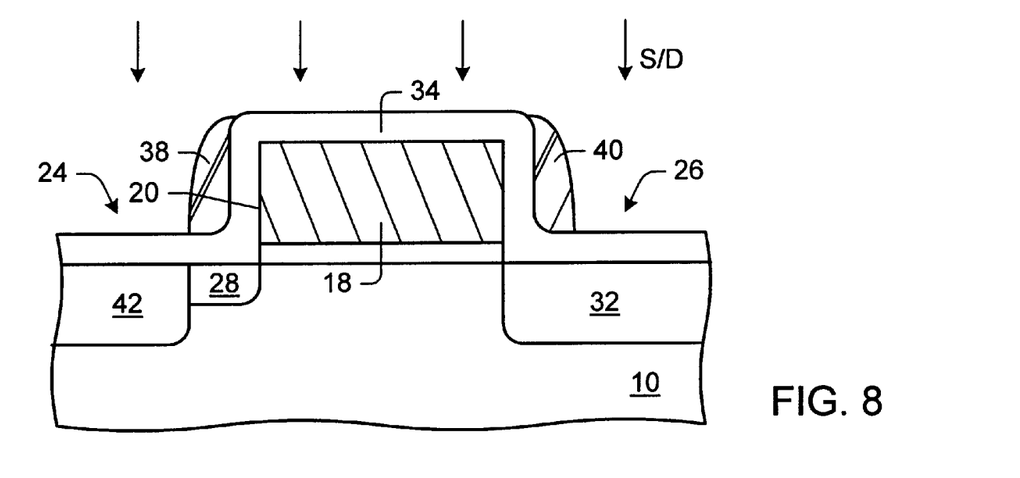
FIG. 8 is a cross-sectional view of the semiconductor topography, wherein a third dopant is implanted into exposed portions of the pair of junctions to form source and drain regions, subsequent to the step in FIG. 7.

Turning to FIG. 8, a heavily doping source/drain ("S/D") implant is forwarded to exposed areas of source and drain regions 24 and 26 and to gate conductor 18. The dopant is preferably of the same type as that used in the second dopant implant. The S/D implant is self-aligned to exposed lateral surfaces of spacers 38 and 40. Thus, a drain region 42 is formed that extends a spaced distance from drain-side sidewall surface 20, outside a portion of drain-side LDD area 28, thereby dominating the LDD/drain overlap area. The remaining LDD area 28 is defined exclusively between the channel (below gate conductor 18) and drain region 42 and thus distributes the maximum electric field Em in the critical drain area while reducing parasitic resistance RS in the source area. Dispersion of Em using this asymmetrical technique reduces HCE but not at the expense of source-drain performance. LDD area 28 and drain region 42 together form a drain-side junction. The drain-side junction, however, is graded. The doped source and drain junctions and gate conductor 18 contain a majority charge carrier opposite that of the surrounding bulk silicon substrate 10.

The dopants are preferably forwarded by ion implantation at an energy and concentration to form reliable source and drain areas onto which a contact structure can be operably connected. The concentration is chosen to effectuate whatever threshold voltage and junction resistance/capacitance is needed to operate the ensuing transistor within desired design specification.

Figure 9:
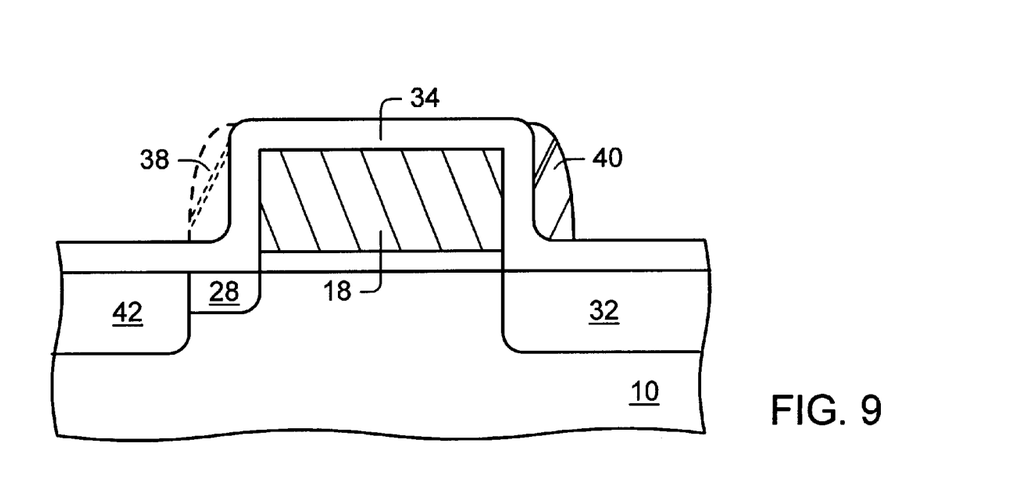
FIG. 9 is a cross-sectional view of the semiconductor topography, wherein the drain-side spacer is removed, subsequent to the step in FIG. 8.

Turning to FIG. 9, spacer 38 may be removed from etch stop material 34. Accordingly, the wet etch composition is one which etches spacer 38 (i.e., silicon nitride) to a much greater extent than the underlying etch stop material 34 (i.e., silicon dioxide). A photoresist masking layer (not shown) preferably covers spacer 40 and prevents its removal. According to one example, silicon nitride material can be etched by reflux boiling phosphoric acid at an elevated temperature. Using this procedure, an etch rate of nitride to underlying thermally grown oxide is at least 4:1.

Figure 10A:
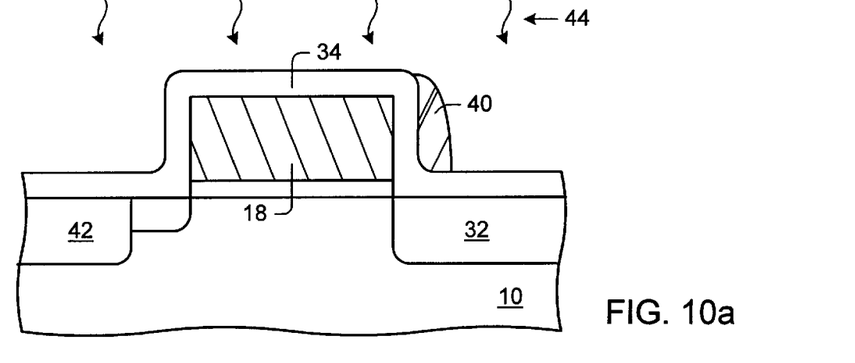
FIG. 10a is a cross-sectional view of the semiconductor topography, wherein the semiconductor topography is subjected to thermal radiation according to one embodiment, subsequent to the step in FIG. 9.
Figure 11A:
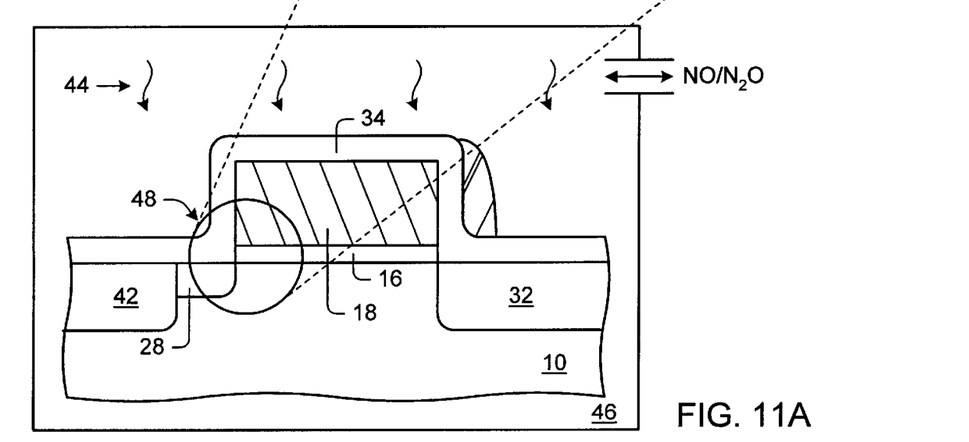
Figure 12A:
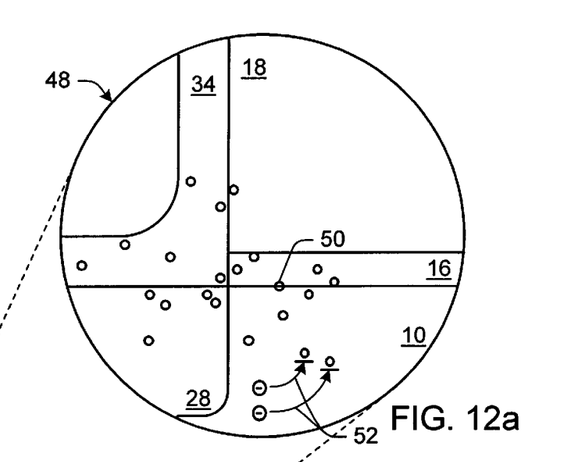
FIG. 12a is a detailed view of section 48 of FIG. 11a, wherein an atomic view is presented illustrative of barrier atoms blocking the migration of charged carriers into the gate oxide during operation of the transistor.

FIGS. 10a, 11a, and 12a, illustrate one embodiment of the steps used to complete the formation of a transistor having reduced HCE. As depicted in FIG. 10a, the semiconductor topography may be subjected to thermal radiation 44. This annealing step is preferably performed using Rapid Thermal Processing ("RTP") which provides for anneal implantations with minimal impurity redistribution. Since most as-implanted impurities do not occupy substitutional sites, this thermal step is employed to bring about electrical activation of the implanted dopants. Furthermore, primary crystalline defect damage that occurs mainly during light ion implantation is substantially reordered and thereby removed by this annealing step. For instance, vacancies and self-interstitials that are in close proximity undergo recombination, and thus remove trapping defects.

Turning to FIG. 11a, another annealing step may be performed at a lower temperature than the previous annealing step. The semiconductor topography may be placed in a chamber 46 into which barrier-entrained gas may pass. While in chamber 46, the semiconductor topography is preferably exposed to thermal energy 44 to cause the barrier atoms to migrate from the gaseous material to an area under gate oxide 16. More specifically, migration occurs through etch stop material 34 to areas of disruption comprising irregular bonds, dangling bonds, or layer junctures where abrupt changes in bond organization occurs. After reaction has occurred, the barrier-entrained gas is evacuated from chamber 46, allowing the chamber to be opened and the wafer to be removed. According to one embodiment, the barrier-entrained gas comprises nitrogen and oxygen in varying proportions. As such, nitrogen is incorporated into a critical area under gate oxide 16 near the drain-side region. Since nitrogen atoms migrate at a faster rate than impurity atoms, a lower temperature is used in this step to prevent nitrogen from diffusing too far below the surface of substrate 10. The previous annealing step required a higher temperature to mobilize the relatively heavy dopant atoms.

The combination of spacer 40 and etch stop 34 at the source-side junction 32 substantially prevents the barrier atoms from entering junction 32 near the channel beneath gate conductor 18. The drain-side junction 42, absent spacer 40, receives the barriers in the critical area throughout LDD 28 and at the interface between the channel and LDD 28. Barrier atoms also migrate somewhat to the interface between the channel, near the drain-side, and the gate oxide adjacent the channel. The interfacial defects at the channel/gate oxide make this area particularly receptive to receiving and retaining the barrier atoms. It is believed that spacer 40 serves therefore to mask barrier atoms from entering the junction in regions directly below the spacer.

Turning now to FIG. 12a, a detailed view along region 48 of FIG. 11a is shown. Barrier atoms 50 (e.g., nitrogen) are located within LDD area 28, and particularly at the gate oxide 16 and channel interface near the drain area (i.e., adjacent the LDD area 28). It is contemplated that atoms 50 migrate mostly through etch stop material 34 and accumulate at bond disruption sites. Those sites occur mostly at the juncture between thin films and, importantly, predominantly at the juncture between gate oxide 16 and substrate 10. The high mobility of the relatively small nitrogen atoms 50 readily bond with various bond opportunities at those disruptions. Bonding of nitrogen serves to block or "plug" the migration pathways into gate oxide 16 and to minimize hot carrier trap opportunities within gate oxide 16. As such, hot carriers sourced from the drain side of LDD area 28 are substantially prevented from entering and being trapped within gate oxide 16. Minimization of hot carrier injection and entrapment is achieved by the barrier characteristics of atoms 50, as shown by reference numeral 52.

Figure 10B:
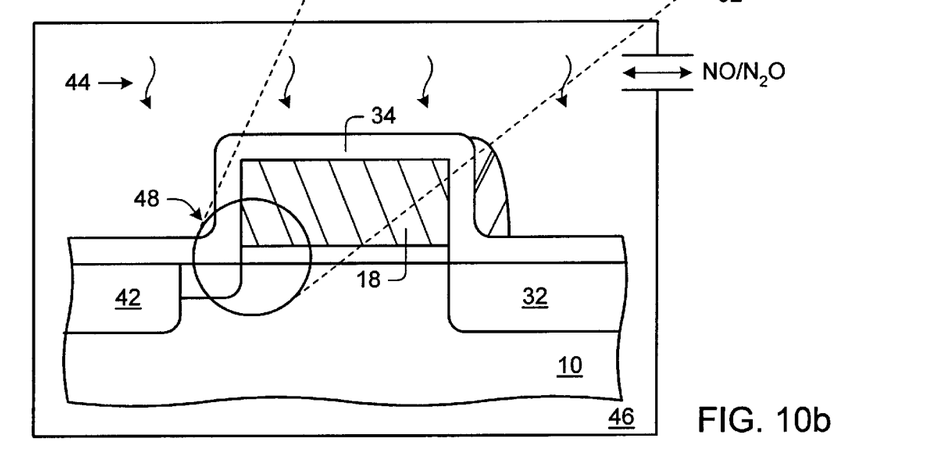
FIG. 10b is a cross-sectional view of the semiconductor topography, wherein the semiconductor topography is subjected to thermal radiation in an ambient containing barrier atoms according to another embodiment, subsequent the step in FIG. 9.
Figure 11B:
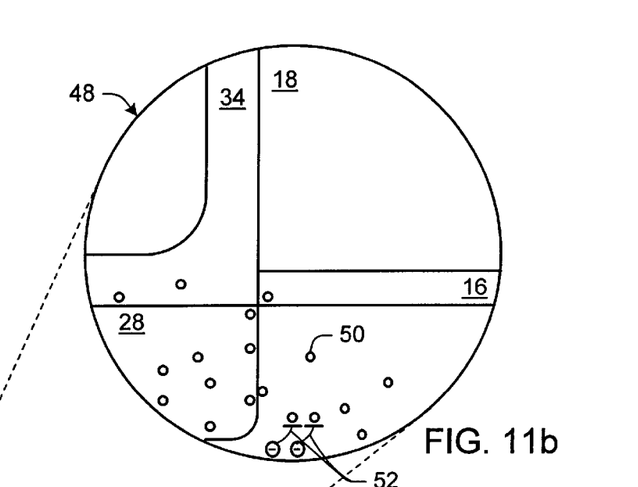
FIG. 11b is a detailed view of section 48 of FIG. 10b, wherein an atomic view is presented illustrative of barrier atoms blocking the migration of charged carriers into the gate oxide during operation of the transistor.

FIGS. 10b and 11b illustrate another embodiment of the present invention in which only one annealing step is performed. The semiconductor topography is simultaneously exposed to thermal radiation 44 and to barrier-entrained gas. A high temperature is used in order to electrically activate impurity atoms, annihilate crystalline defect damage, and drive barrier atoms from the gas into substrate 10. FIG. 11b illustrates a portion 48 of FIG. 10b in more detail. The main difference between the embodiment shown in FIG. 11b and that shown in FIG. 12a is that the bulk of barrier atoms 50 (nitrogen) are located further below the surface of substrate 10. The higher temperature causes barrier atoms 50 to migrate to a greater depth. Barrier atoms 50 thusly placed prevent hot carriers from approaching gate oxide 16, thereby reducing hot carrier injection and trapping within gate oxide 16, as shown by reference numeral 52. It is desirable that barrier atoms do not migrate below LDD area 28 since the hot carriers mainly enter gate oxide 16 from the drain-side LDD area. If very few barrier atoms exist laterally adjacent to LDD area 28, then hot carrier injection may still be a problem.

It is preferred, regardless of whether anneal is performed in two steps or one, that the barrier atoms exist at the location within the LDD, LDD/channel and the channel/gate oxide, to effectively block migration of hot carriers to trap sites within the gate conductor. If the barrier atoms are driven deep below the substrate surface, there may be an opportunity for hot carriers to traverse into the gate conductor from a region shallower than the majority of barrier atoms. The single step anneal temperature must therefore be carefully controlled relative to the desired depth at which the barrier atoms finally reside. It is preferred that the anneal be chosen to place the peak concentration density of barrier atoms between, for example, 0.1 to 0.3 $\mu$m. A two step anneal appears beneficial in that the desired profile constraints of a heavier n- or p-type post implant anneal will not affect a subsequent, lighter barrier anneal. The barrier anneal in the two step anneal can therefore be chosen to optimally place the barrier atoms at the diffusion and migration avenue between the drain region and the gate conductor proximate to the drain region.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A transistor, comprising:
   a gate conductor dielectrically spaced above a substrate, said gate conductor having opposed first and second sidewall surfaces;
   an etch stop material extending from said pair of sidewall surfaces to define an etch stop lateral surface;
   a spacer extending from said etch stop material adjacent the first sidewall surface to define a spacer lateral surface, and said second sidewall surface having no corresponding spacer;
   a source extending laterally within said substrate from a region directly below said first sidewall surface;
   a drain extending laterally within said substrate from a region directly below a spaced lateral distance from said second sidewall surface; and
   barrier atoms below said gate conductor, wherein said barrier atoms are more concentrated near said drain than said source.

2. The transistor as recited in claim 1, further comprising a lightly doped drain area laterally bounded within said substrate between regions directly below said second sidewall surface and said spaced lateral distance.

3. The transistor as recited in claim 2, wherein said lightly doped drain area comprises a lower concentration of dopant than dopant within said source and drain.

4. The transistor as recited in claim 1, wherein said barrier atoms are distributed within a gate dielectric between said gate conductor and said substrate.

5. The transistor as recited in claim 1, wherein said barrier atoms are distributed within said substrate.

6. The transistor as recited in claim 1, wherein said barrier atoms are distributed below said gate conductor within 0.2 $\mu$m of said drain.

7. The transistor as recited in claim 1, wherein said barrier atoms distributed below said gate conductor within 0.1 $\mu$m of said drain.

8. The transistor as recited in claim 4, wherein said barrier atoms comprise nitrogen atoms.

9. The transistor as recited in claim 5, wherein said barrier atoms are distributed at a peak concentration density between 0.1 to 0.3 $\mu$m below the substrate surface.

10. The transistor as recited in claim 5, wherein said barrier atoms comprise nitrogen atoms.

11. A transistor, comprising:
    a gate conductor;
    a spacer on a first side of said gate conductor;
    a source region and a drain region formed within a substrate below said gate conductor, said source region on said first side of said gate conductor and said drain region on said second side of said gate conductor; and
    barrier atoms in a channel region below said gate conductor, wherein the bulk of said barrier atoms are below an upper surface of said substrate, wherein the area directly below said spacer is substantially free of said barrier atoms.

12. A transistor, comprising:

a gate conductor;

first and second junction regions formed within a substrate below said gate conductor and on opposite sides of said gate conductor;

a channel below said gate conductor and between said first and second junction regions; and barrier atoms in a channel region below said gate conductor, said barrier atoms being more concentrated near the interface between the first junction region and channel than near the interface between the second junction region and channel.

13. The transistor as recited in claim 12, wherein said first junction region comprises a lightly doped drain region.

14. The transistor as recited in claim 13, wherein said second junction region is a source region and does not include a lightly doped region corresponding to said lightly doped drain region.

15. The transistor as recited in claim 11, wherein said barrier atoms comprise nitrogen atoms.

* * * * *